(12) United States Patent
Takayanagi et al.

(10) Patent No.: US 7,829,837 B2
(45) Date of Patent: *Nov. 9, 2010

(54) LOW DARK CURRENT PIXEL WITH A GUARD DRIVE ACTIVE PHOTODIODE

(75) Inventors: Isao Takayanagi, Tokyo (JP); Junichi Nakamura, Tokyo (JP)

(73) Assignee: Aptina Imaging Corporation, Grand Cayman (KY)

(*) Notice: Subject to any disclaimer, the term of this patent is extended or adjusted under 35 U.S.C. 154(b) by 197 days.

This patent is subject to a terminal disclaimer.

(21) Appl. No.: 12/000,574

(22) Filed: Dec. 13, 2007

(65) Prior Publication Data

US 2008/0164549 A1 Jul. 10, 2008

Related U.S. Application Data

(63) Continuation of application No. 10/226,197, filed on Aug. 23, 2002, now Pat. No. 7,388,183.

(51) Int. Cl.
*H01L 31/00* (2006.01)
*H01L 27/00* (2006.01)
*H01L 31/062* (2006.01)
*G01J 1/44* (2006.01)
*H04N 3/14* (2006.01)

(52) U.S. Cl. ............ 250/214.1; 250/208.1; 250/214 R; 348/308; 257/292

(58) Field of Classification Search ............ 250/208.1, 250/214 R, 214.1; 348/302, 308, 310, 313; 257/291–292, 431

See application file for complete search history.

(56) References Cited

U.S. PATENT DOCUMENTS

| 4,065,668 | A | 12/1977 | Monticelli |
| 5,274,459 | A | 12/1993 | Hamasaki |
| 5,656,806 | A | 8/1997 | Dautriche |
| 5,953,060 | A | 9/1999 | Dierickx |
| 6,031,217 | A | 2/2000 | Aswell et al. |
| 6,580,063 | B1 | 6/2003 | Okamoto |
| 7,388,183 | B2 * | 6/2008 | Takayanagi et al. ...... 250/208.1 |

FOREIGN PATENT DOCUMENTS

| GB | 2 161 665 | 1/1986 |
| JP | 53-14589 | 2/1978 |
| JP | 61-219184 | 9/1986 |
| JP | 1-205463 | 8/1989 |
| JP | 4-174566 | 6/1992 |
| JP | 10-256593 | 9/1998 |
| JP | 2001-168374 | 6/2001 |
| WO | WO 00/19705 | 4/2000 |
| WO | WO 00/47021 | 6/2001 |

* cited by examiner

*Primary Examiner*—Georgia Y Epps
*Assistant Examiner*—Don Williams
(74) *Attorney, Agent, or Firm*—Dickstein Shapiro LLP

(57) ABSTRACT

A method and apparatus for reducing thermally generated dark current in a CMOS imaging device is disclosed. A photodiode within the imaging device is kept zero-biased, so that the voltage is equal at both ends of the photodiode. This zero-biasing is accomplished using several different techniques, including, alternatively: a transistor operating at its sub-threshold level; a leaky diode; a short-channel MOSFET; or ramping charge injection.

9 Claims, 14 Drawing Sheets

US 7,829,837 B2

LOW DARK CURRENT PIXEL WITH A GUARD DRIVE ACTIVE PHOTODIODE

CROSS REFERENCE TO RELATED APPLICATIONS

The present application is a continuation of U.S. application Ser. No. 10/226,197, filed on Aug. 23, 2002, now U.S. Pat. No. 7,388,183 the disclosure of which is herewith incorporated by reference in its entirety.

FIELD OF THE INVENTION

The invention relates to a technique for suppressing unwanted thermal generation of current, and particularly to the suppression of thermally generated dark current in a pixel of an imaging device.

BACKGROUND OF THE INVENTION

Dark current refers to an undesired signal generated by a pixel of an imaging device even in the absence of a light signal. One source of dark current is thermally-generated energy. Thermally generated dark current in a CMOS active pixel imaging device presents problems in many imaging applications. For example, some automotive applications require stable pixel performance at temperatures ranging between 60 and 80 degrees Celsius. As temperature increases, dark current likewise increases. Additionally, some digital still cameras require increasingly longer integration times, which allows for higher sensitivity against photo current. However, the longer the integration time the higher the sensitivity to thermally generated dark current. Consequently, a need exists for a circuit which inhibits the generation of thermally generated dark current.

BRIEF SUMMARY OF THE INVENTION

In one aspect, the invention provides an imaging pixel having a photo conversion device for producing an electrical signal at a first node thereof in response to incident light energy; an electrical circuit for receiving the electrical signal at the first node and producing a pixel output signal therefrom; and a circuit path for providing the output signal to a second node of the photo conversion device. The circuit path produces a zero net bias across the photo conversion device to reduce generation of thermally induced dark current. In different embodiments, the electrical circuit may be a voltage follower circuit or a source follower circuit.

In another aspect, the invention provides a method of operating a pixel cell to provide a zero bias across a photo conversion device to reduce thermally induced dark current. These and other features and advantages of the invention will be better understood from the following detailed description which is provided in connection the accompanying drawings.

DETAILED DESCRIPTION OF THE INVENTION

Figure 1:
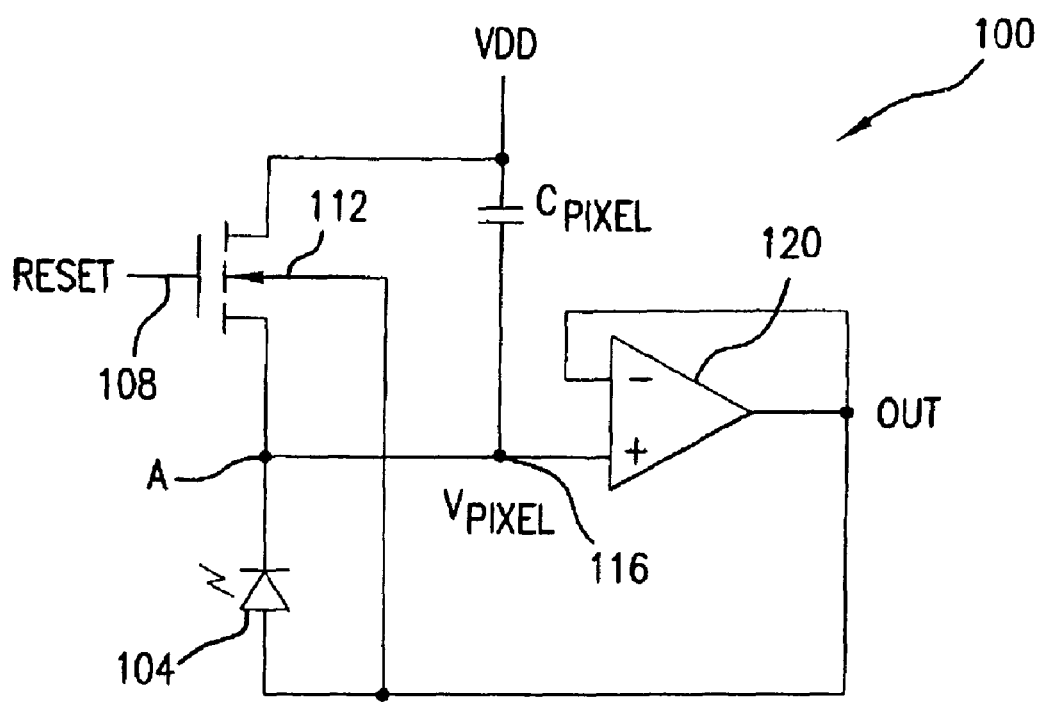
FIG. 1 is a schematic diagram of a first embodiment of the invention.

FIG. 1 illustrates a pixel cell 100 in accordance with a first embodiment of the invention which comprises a photodiode 104 having a charge accumulation node A connected to a reset switch transistor 108, the other side of which is connected to a potential source $V_{DD}$, a capacitor $C_{PIXEL}$ connected between node A and potential source $V_{DD}$, and an output circuit 120 configured as a voltage follower coupled to node A and providing a pixel output signal. The circuit 100 is an operational amplifier 120 having a positive input connected to node A and a negative input connected to the amplifier 120 output, which is also coupled to the side of the photodiode 104 opposite node A.

Within the reset transistor 108, the middle arrow signifies that a portion 112 of the transistor 108 between its source and drain (known as a bulk substrate) has an electrical connection wired thereto. In the pixel 100 the bulk substrate 112 is driven by the differential amplifier 120 following the $V_{PIXEL}$ at the node 116. Unwanted thermal current is reduced by biasing zero volts across the photodiode 104. Although the capacitor $C_{PIXEL}$ is shown connected to $V_{DD}$, it could also be connected to ground or a voltage source other than $V_{DD}$. Since the applied voltage across the photodiode 104 is always kept at zero volts by the differential amplifier 120, the capacitance at the photodiode 104 does not contribute to the charge conversion gain. Therefore, the conversion gain of the FIG. 1 circuit is largely determined by the value of $C_{PIXEL}$.

The circuit of FIG. 1 operates as follows. The node A pixel voltage $V_{PIXEL}$ is initialized to a reset voltage through the reset transistor 108, and this value is selectively read from the OUT node of the amplifier 120 to a sample and hold circuit. After reset, the photodiode 104 produces an integrated charge signal at node A which is stored on the capacitor $C_{PIXEL}$. This too is selectively read out to a sample and hold circuit.

The junction bias of the photodiode 104 is kept at zero during the reset and charge integration periods by the output of the voltage follower amplifier 120, which is coupled to the backside of the photodiode 104, that is, the side opposite node A. Because the junction of the photodiode 104 is zero-biased, there is no net current flow through the photodiode 104 to generate dark current. Moreover, the substrate of the reset transistor 108 also receives the output of the amplifier 120.

In this way, all junctions connected to the integration node A of FIG. 1 are zero biased, so that thermal leakage is thereby suppressed. Additionally, high conversion gain and therefore high sensitivity are achieved because they are determined solely by the gain capacitor $C_{PIXEL}$.

Figure 2:
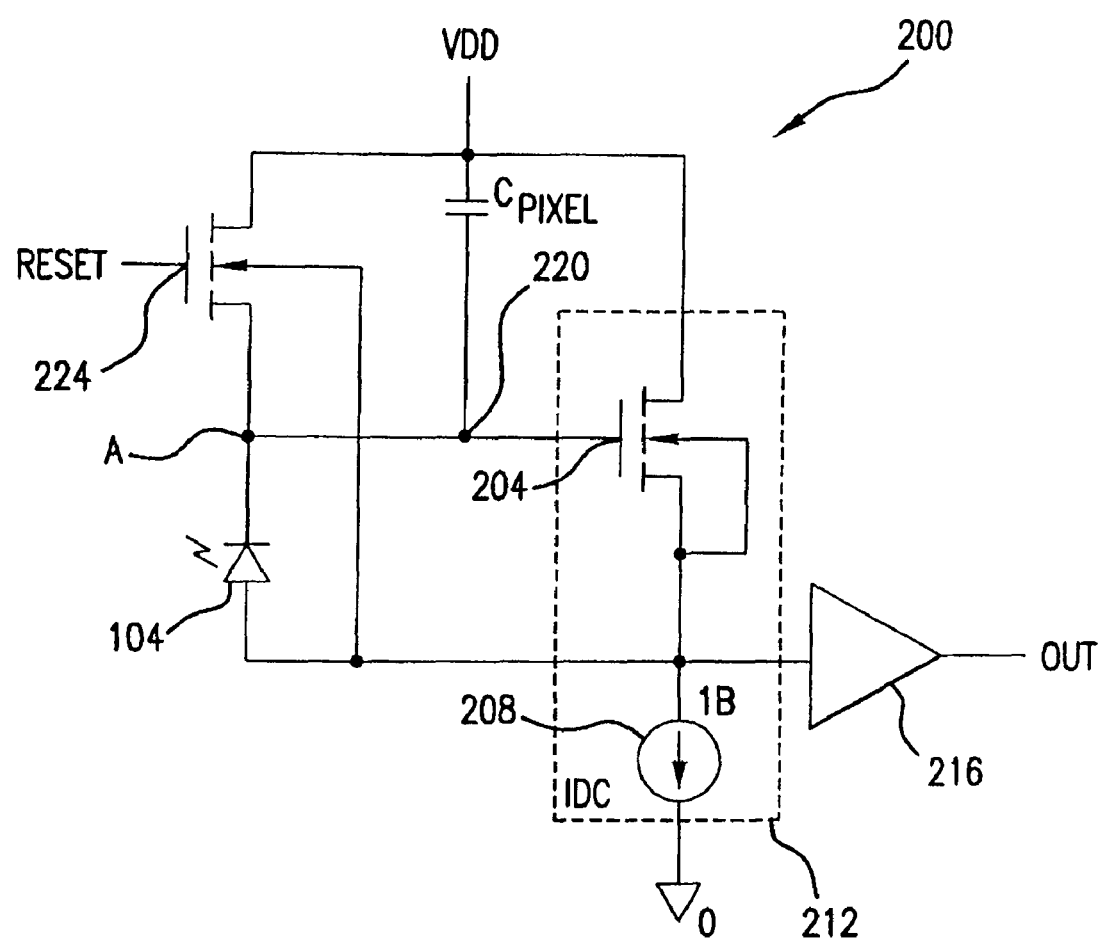
FIG. 2 is a schematic diagram of a second embodiment of the invention.

A second embodiment of the present invention is shown in FIG. 2, in which a source follower circuit 212 is used in place of the voltage follower circuit 120 of FIG. 1. The source follower circuit 212 includes a zero-threshold transistor 204 connected to a current source 208 and has a gate connected to node A. The pixel 200 differs from the pixel 100 in that that a buffer amplifier 216 is provided which does not have its output wrapped around and tied to the back side of the photodiode 104. However, the voltage across the photodiode 104 is still kept at zero, this time by the source follower circuit 212 which has an output coupled to the back side of the photodiode 104 and to the input of the buffer amplifier 216. The zero-threshold transistor 204 has a threshold voltage of zero, so that the source follower circuit 200 always provides output voltage to the back side of the photodiode 104 corresponding to the input voltage at the node 220. The transistor is held at a zero-threshold by controlling the impurity concentration beneath the gate of the transistor 204, which is also known as gate implantation. The source of the transistor 204 is connected to that transistor's bulk substrate, so that a "body effect" is eliminated and good linearity with unity gain is held in the source follower circuit 212. Consequently, the source follower circuit 212 can always keep zero-biasing across the photodiode 104 independent of any charge-accumulation condition.

Figure 3:
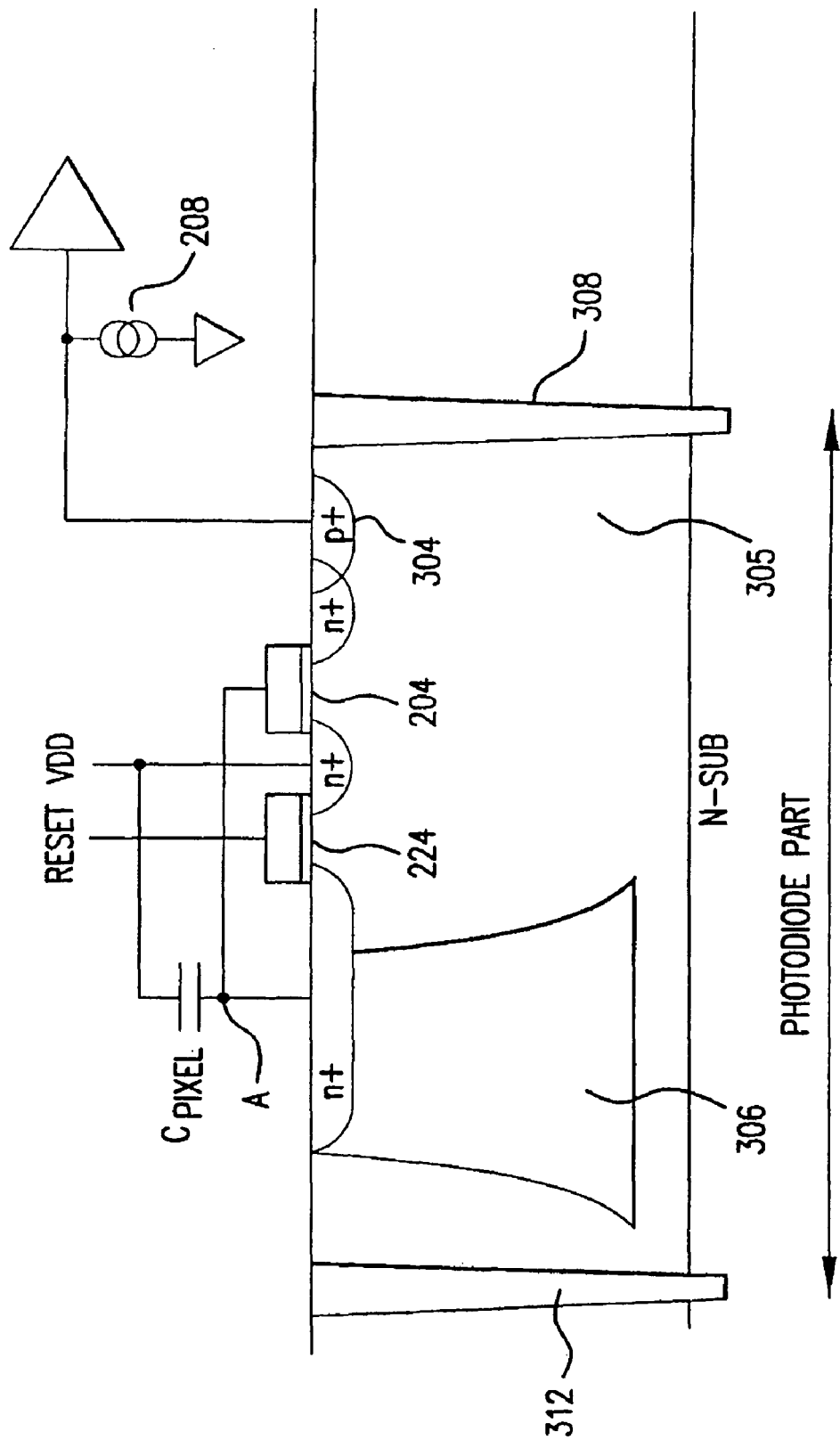
FIG. 3 is a cross sectional view of the photodiode shown in FIGS. 1 and 2.

FIG. 3 shows a schematic cross section of the pixel 200 in a semiconductor substrate. As shown in FIG. 3, the photodiode N+ charge collection region as well as the gate of the transistor 204 and the drain of transistor 224 are connected to the integration node A. In addition, the drain of the transistor 204 provides both an output to the buffer amplifier 216 and is also connected to the P well 305 by a P+ region 304 provided in the P well 305. The P well 305 forms the back side of the photodiode 104. The P well 305 is formed on the N-type substrate. In order to improve sensitivity of the photodiode 104 under zero biasing across the photodiode 104, the dopant concentration beneath the photodiode N+ charge collection region is partially decreased, so that generated electrons in the low concentration region 306 are gathered into the N+ charge collection region by a carrier diffusion process.

The arrangements of FIGS. 2 and 3 provide high dynamic range and excellent linearity. Although FIG. 3 shows trench isolation regions 308 and 312 (also known as STI regions), other isolation techniques could also be used such as nwell isolation or LOCOS. The trench isolation (STI) regions 308 and 312 are formed by etching out a trench and filling it with an insulator such as an oxide, which assists in isolating each individual pixel. To the right of the transistor 204, the n+ drain region and the p+ well control region 304 are overlapped. The P well region 305 in which the photodiode 104 is located is driven by the source follower circuit 212, following signal integration on the capacitor $C_{PIXEL}$. In this way, the well region 304 acts as a guard of the photodiode and is driven by the voltage follower amplifier 120, hence the term "guard drive" photodiode.

Figure 4:
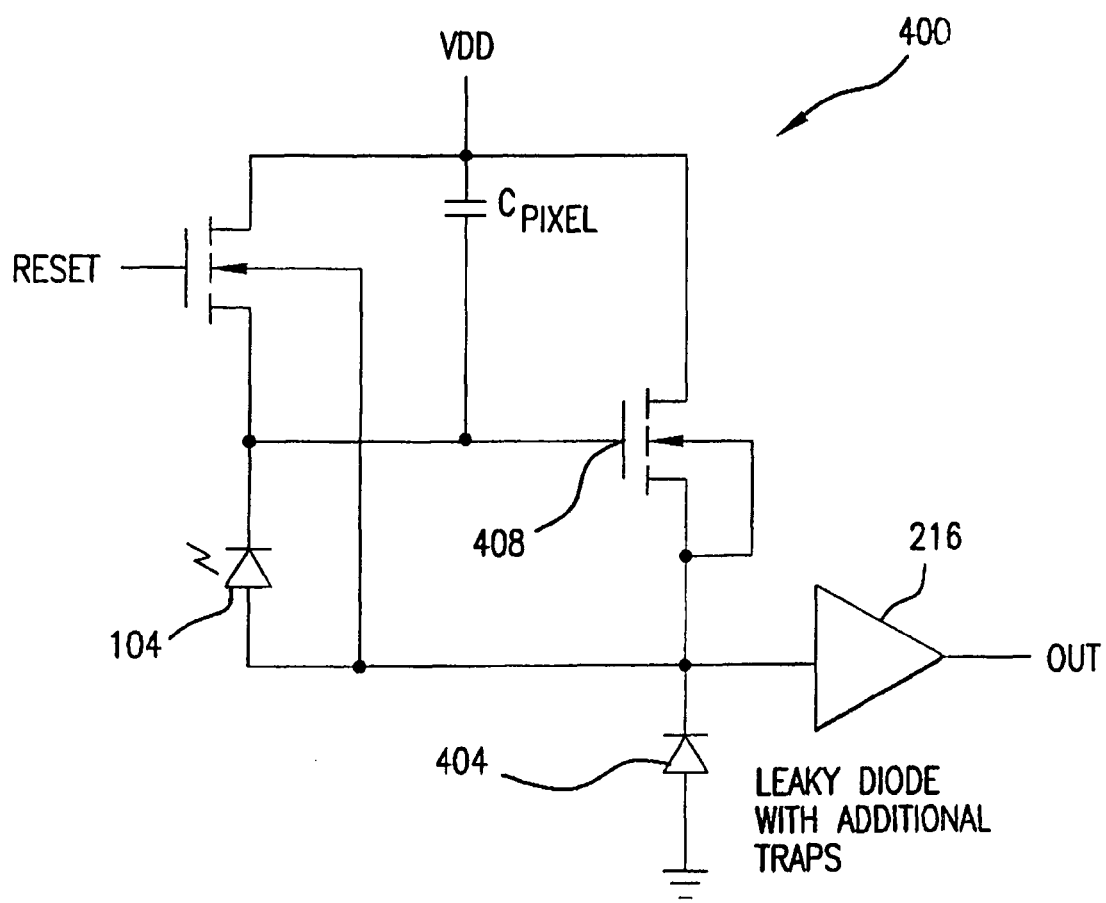
FIG. 4 is a schematic diagram of a third embodiment of the invention.
Figure 4A:
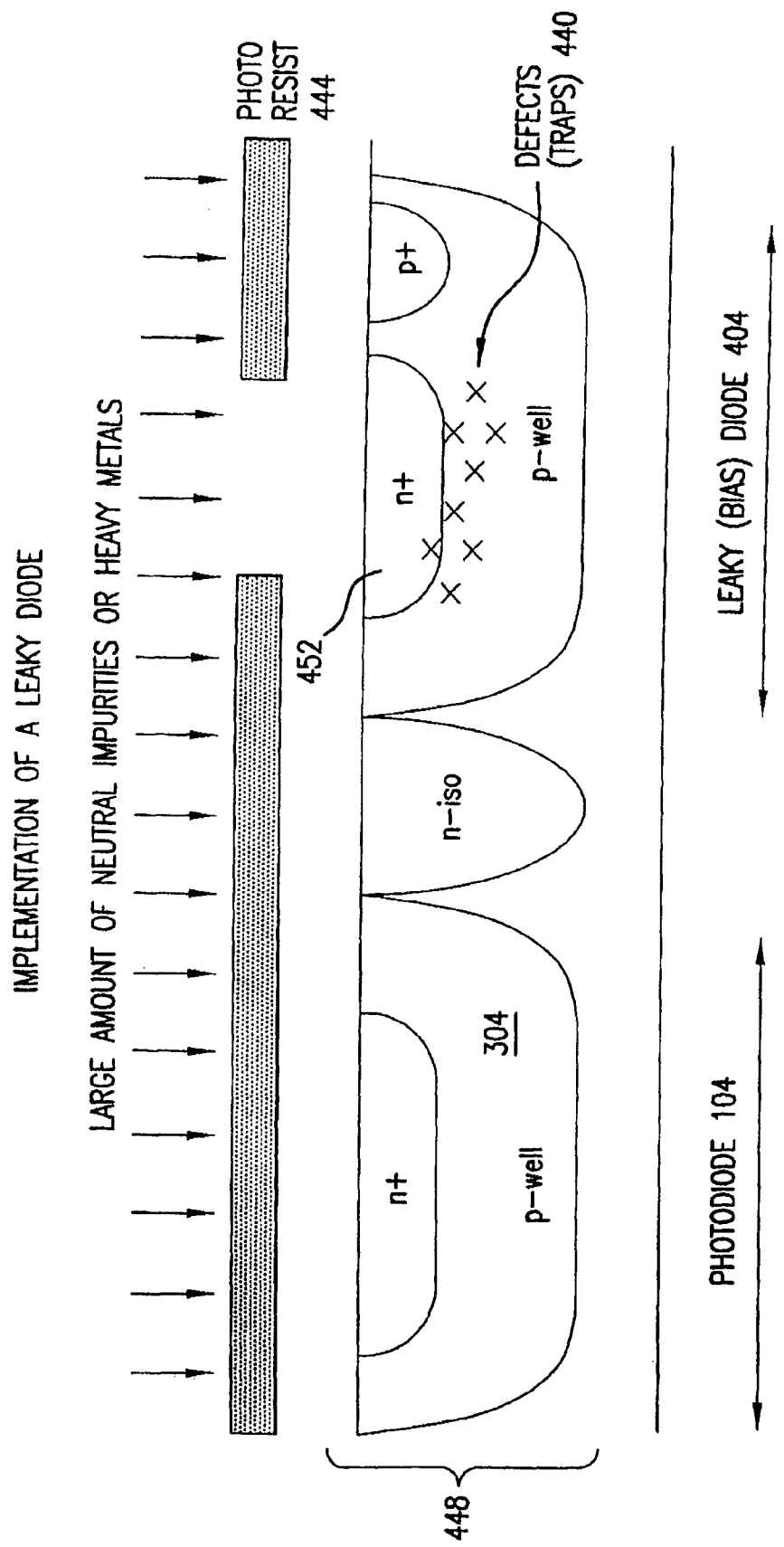
FIG. 4A is a schematic diagram of the leaky diode of FIG. 4.

It is desired to keep the current flow through the current source 208 as small as possible to minimize image power consumption, as one current source 208 is needed for each individual pixel. Thus, for an array of one million pixels, an overall current consumption of 1 mA would require that the current be less than 1 nA/pixel. Therefore, an equivalent resistance of several GΩ is needed. However, it is difficult to achieve such high levels of resistance with conventional resistor materials such as diffusion layers or polysilicon layers. To address the above problems, FIG. 4 shows a pixel circuit 400 having a current source in the form of a leaky diode 404. The trap density of the diode 404 can be increased by increasing the amount of neutral impurities or traps 440 contained within the junction of the diode 404 during fabrication, which in turn affects the reverse-biased current flowing therethrough, as shown in FIG. 4A. Because of the very low amount of reverse-biased current, the transistor 408 is operated in its sub-threshold mode, in which the threshold voltage $V_{TH}$ (or $V_{GS}$) decreases with increasing temperature. The source follower transistor 408, like the transistor 204 (FIG. 2), is described as a zero-threshold transistor when in actuality its threshold voltage is merely very low. Because the leakage current of the diode 404 increases with increasing temperature, this has the effect of offsetting the temperature dependence of the zero-threshold transistor 408.

A more detailed view of the leaky diode 404 is shown in FIG. 4A, where all portions of a substrate 448 except an n+ region 452 are covered by a photo resist 444 and then implanted with a large amount of neutral impurities or heavy metals. This implantation gives rise to a controllable amount of defects or traps 440 in the diode 404, which has the effect of allowing a quantifiable amount of leakage current. This controllable leakage current is used with the output of the source follower transistor 408 to zero-bias the photodiode 104.

Figure 5:
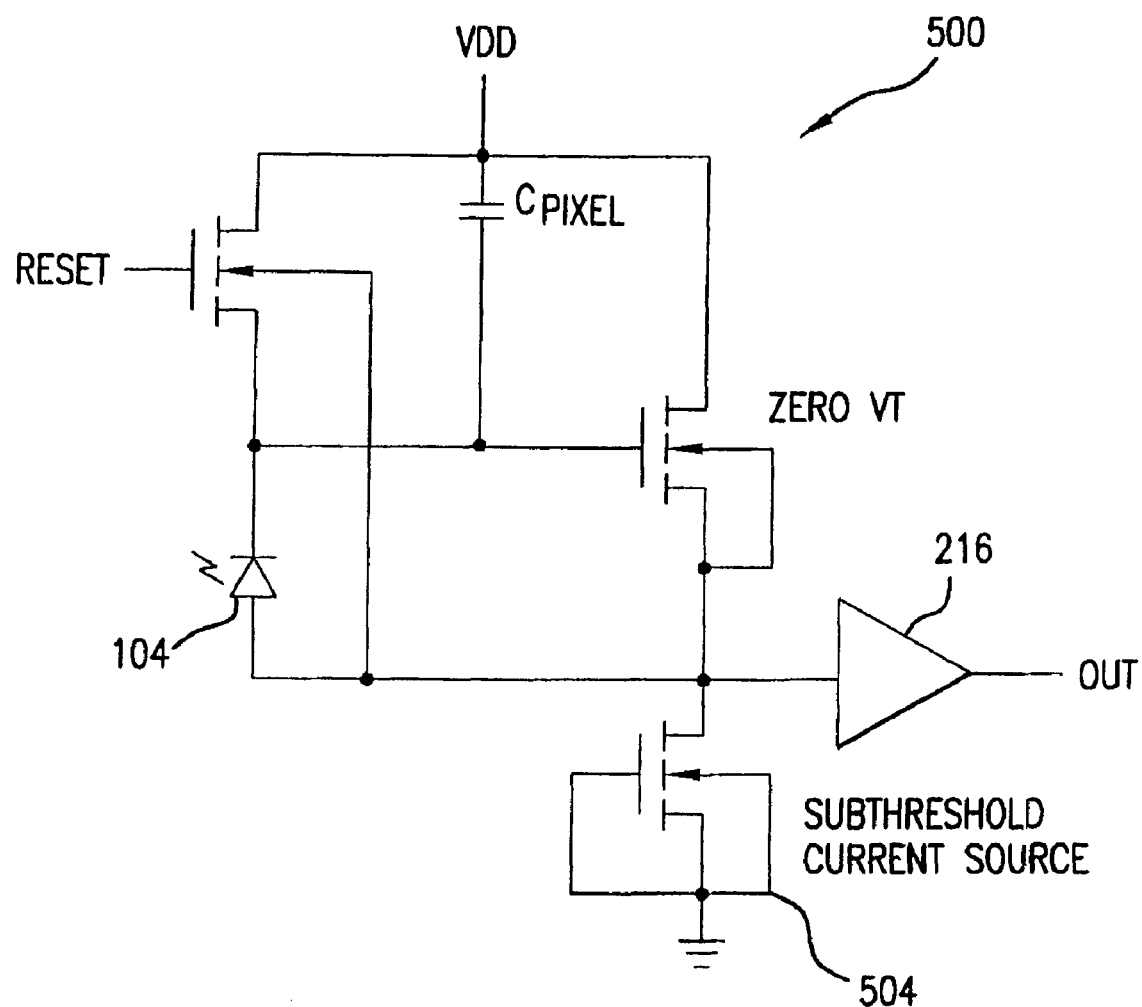
FIG. 5 is a schematic diagram of a fourth embodiment of the invention.

Another way of generating current for the purpose of maintaining the photodiode 104 at a zero bias is shown in FIG. 5, where a subthreshold current source 504 is used within the pixel circuit 500. The subthreshold current source 504 employs a gate-grounded short channel MOSFET transistor. Such a transistor is superior to the zero-threshold transistor 408 of FIG. 4 in that the transistor 408 is always subject to a small amount of channel current, in the range of several pA to several nA. This is true even when $V_{GS}$ is zero. Conversely, the gate-grounded short channel transistor 504 is not subject to unwanted channel current. As with the pixel 400, this stability has the effect of offsetting the temperature dependence of the photodiode 104. Although the pixel 500 does not require special process steps, it does require an additional transistor 504.

Figure 6:
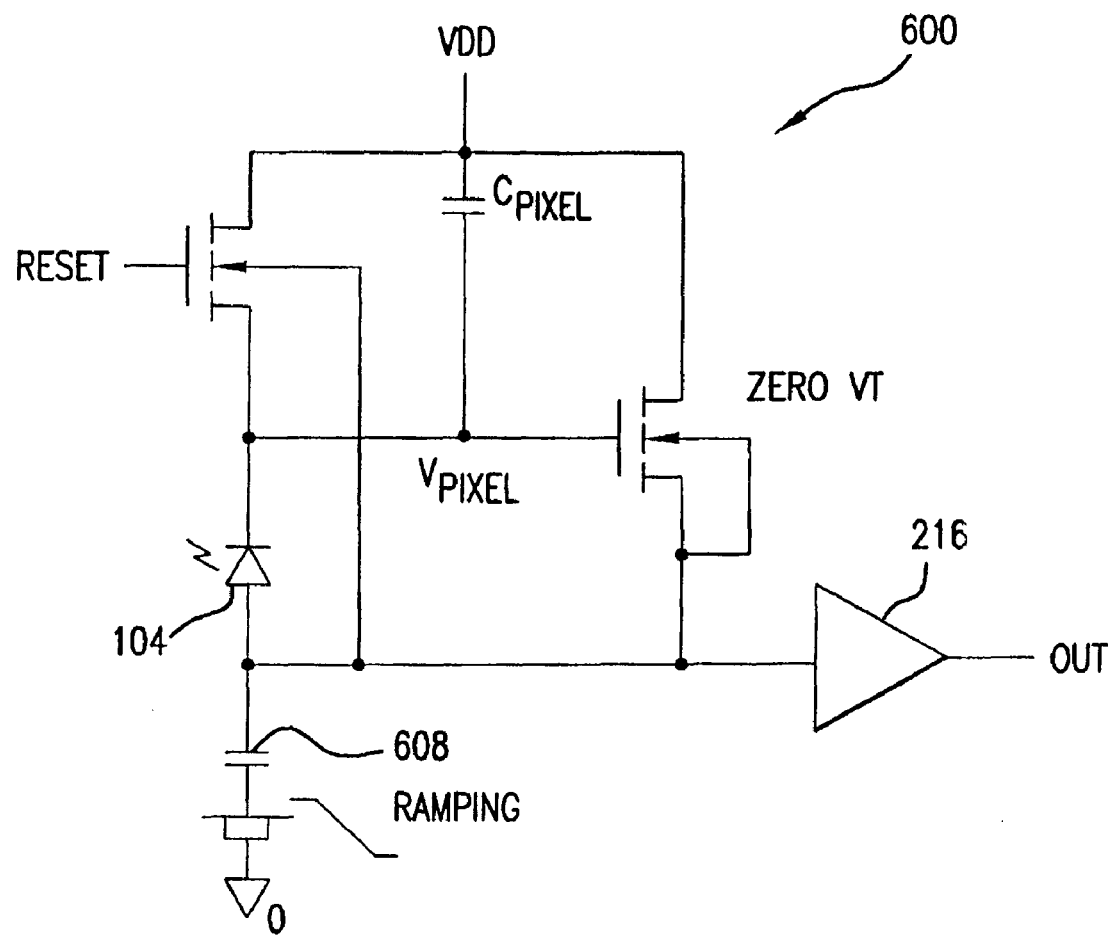
FIG. 6 is a schematic diagram of a fifth embodiment of the invention.

FIG. 6 shows a pixel circuit 600 which uses an approach that differs from the pixels 400 and 500 in that it uses ramping charge injection rather than current sources 404 and 504 to zero-bias the photodiode 104. After a reset operation, a negative-slope ramping pulse is applied to a capacitor 608, which is attached to the guard node (backside) of the photodiode 104. The ramping pulse generates a bias current which can be expressed as $$I_{BIAS} = C_{BIAS} \times dv/dt \quad (1)$$

Recent advances in CMOS capacitor fabrication techniques have increased uniformity reproducibility of capacitor yields. This in turn increases the accuracy of the bias current control of the pixel 600.

Figure 7:
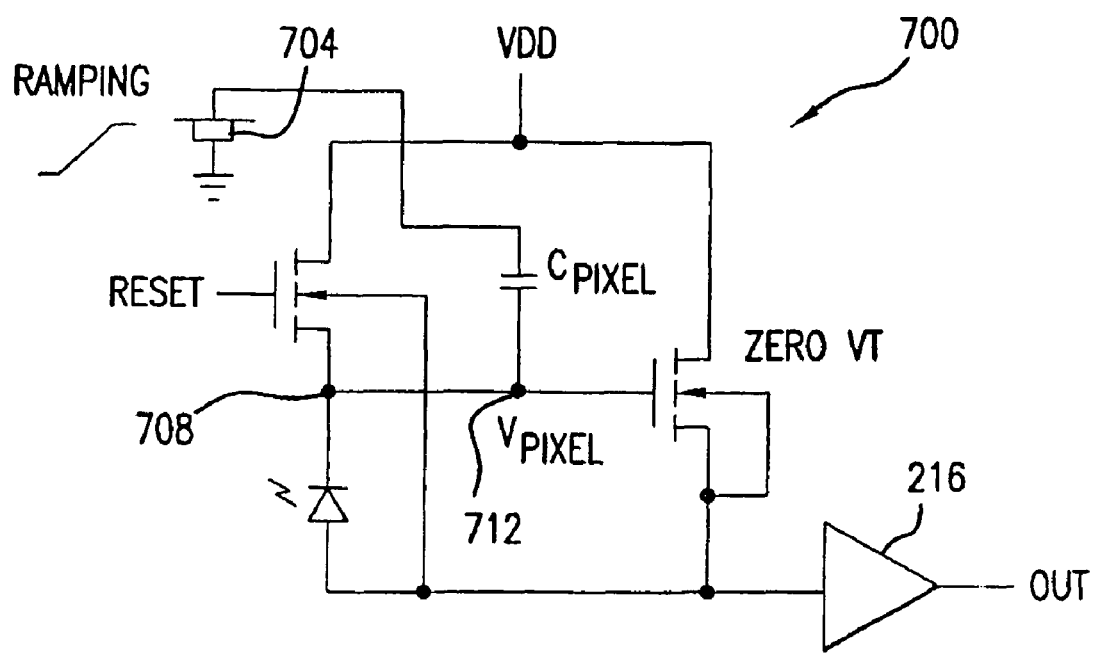
FIG. 7 is a schematic diagram of a sixth embodiment of the invention.

FIG. 7 shows another pixel 700 which generates bias current using a ramping technique. Here the upper electrode of the capacitor $C_{PIXEL}$ is connected to a ramping pulse generator 704 instead of $V_{DD}$ as in the prior embodiments. The other side of the ramping pulse generator 704 is applied to the substrate ground. A positive-slope ramping pulse 716 is applied to the capacitor $C_{PIXEL}$ during the integration period. Due to this current being injected through $C_{PIXEL}$, the voltage at the integration node 712 (and hence the guard node 708) increases with time. The ramping pulse generates a bias current which can be expressed as $$I_{BIAS} = C_{WELL\ SUB} \times dv/dt \quad (2)$$

where $C_{WELL\_SUB}$ and dv/dt denote a capacitance between the guard node 708 and substrate and the slope of the applied ramping pulse 716, respectively. Because the positive slope ramping charge 716 is applied directly to the substrate, no additional capacitor is needed.

Figure 8:
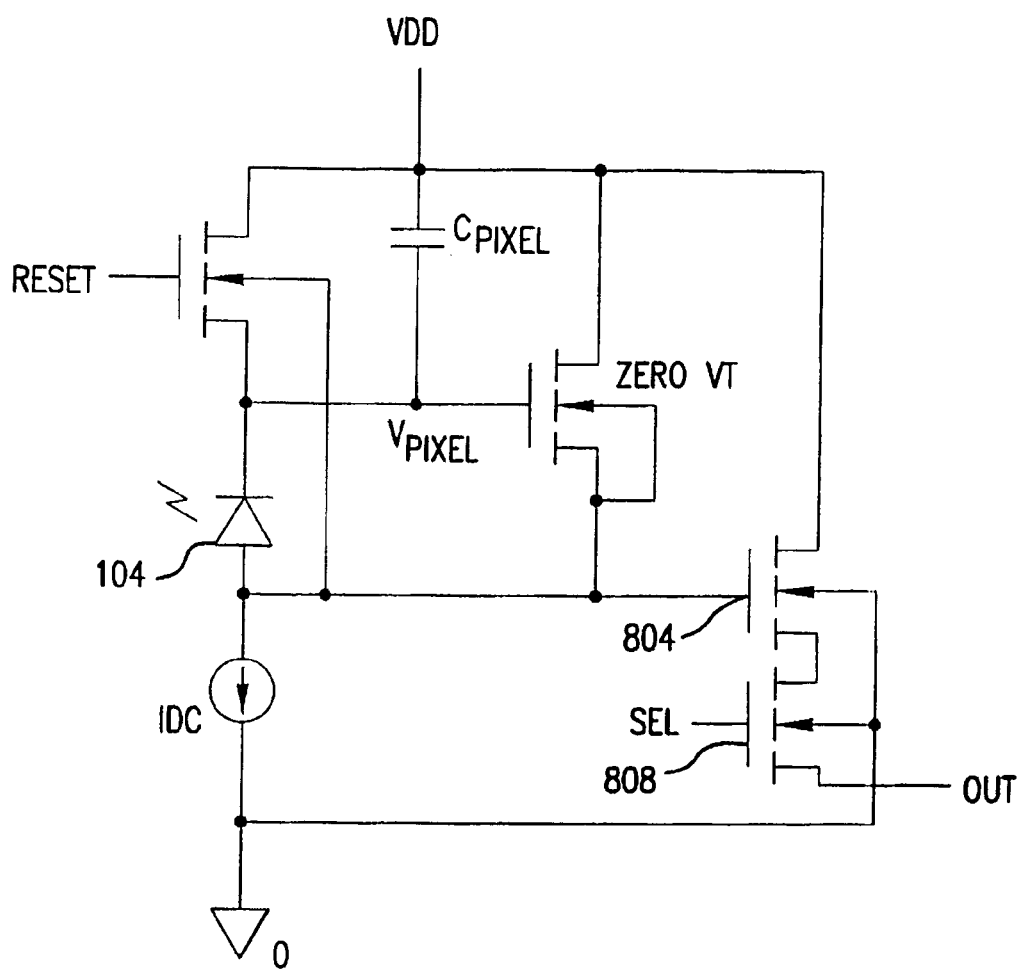
FIG. 8 is a schematic diagram of an NMOS implementation of the read-out portion of the invention.
Figure 9:
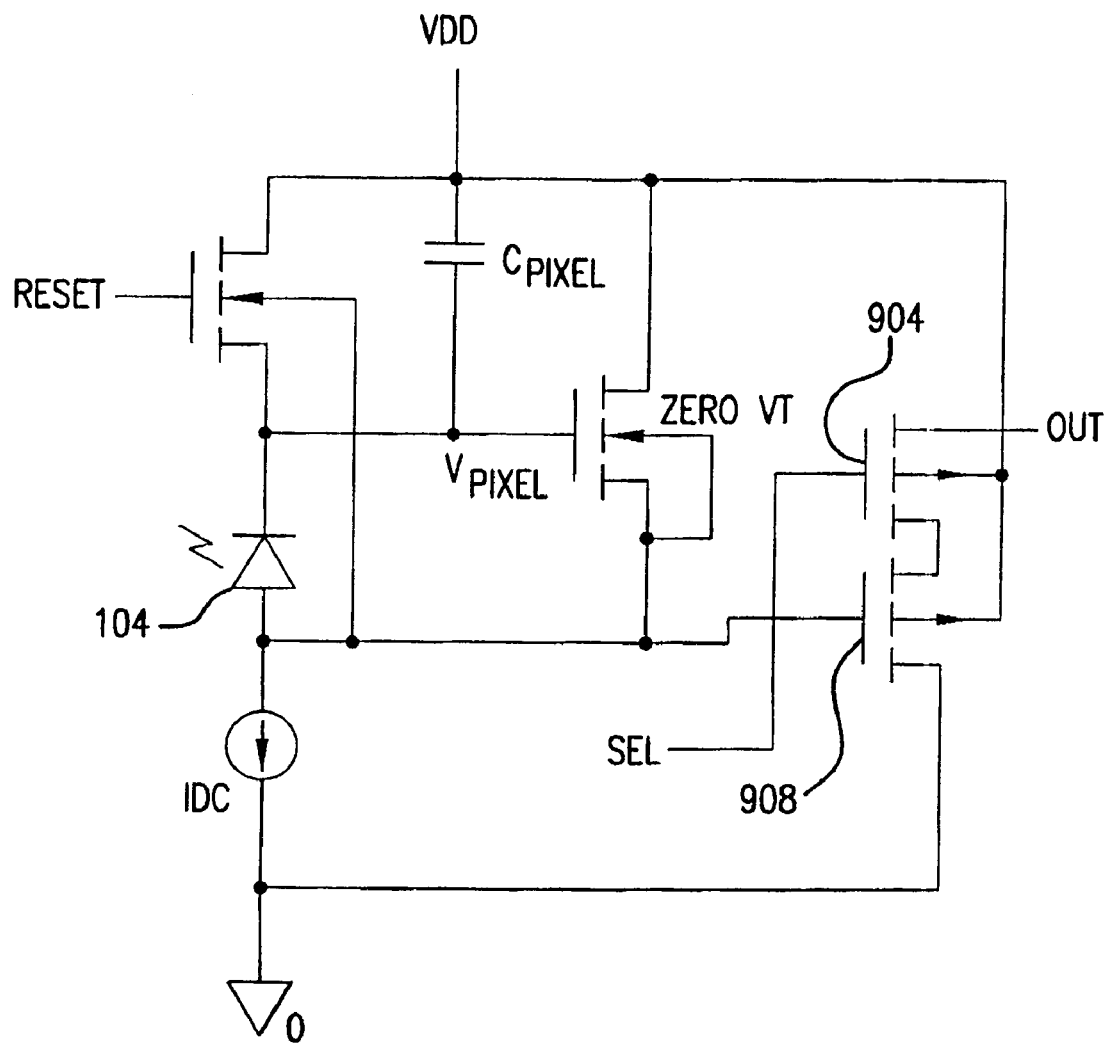
FIG. 9 is a schematic diagram of a PMOS implementation of the read-out portion of the invention.

To read out the signals integrated in the photodiode 104, it is necessary to implement a pixel selector into the amplifier 216 shown in prior embodiments. In FIGS. 8 and 9, NMOS and PMOS source followers 804, 904 and selection transistors 808, 908 are used to select and read out the pixel signal. The source followers 804, 904 are located in a different well region from the photodiode 104 so that they don't affect the photodiode characteristics, which reduces noise from the readout components. Because, the source followers 804, 904 act as a voltage buffer, there is no longer any need for a separate buffer amplifier 216.

Figure 10:
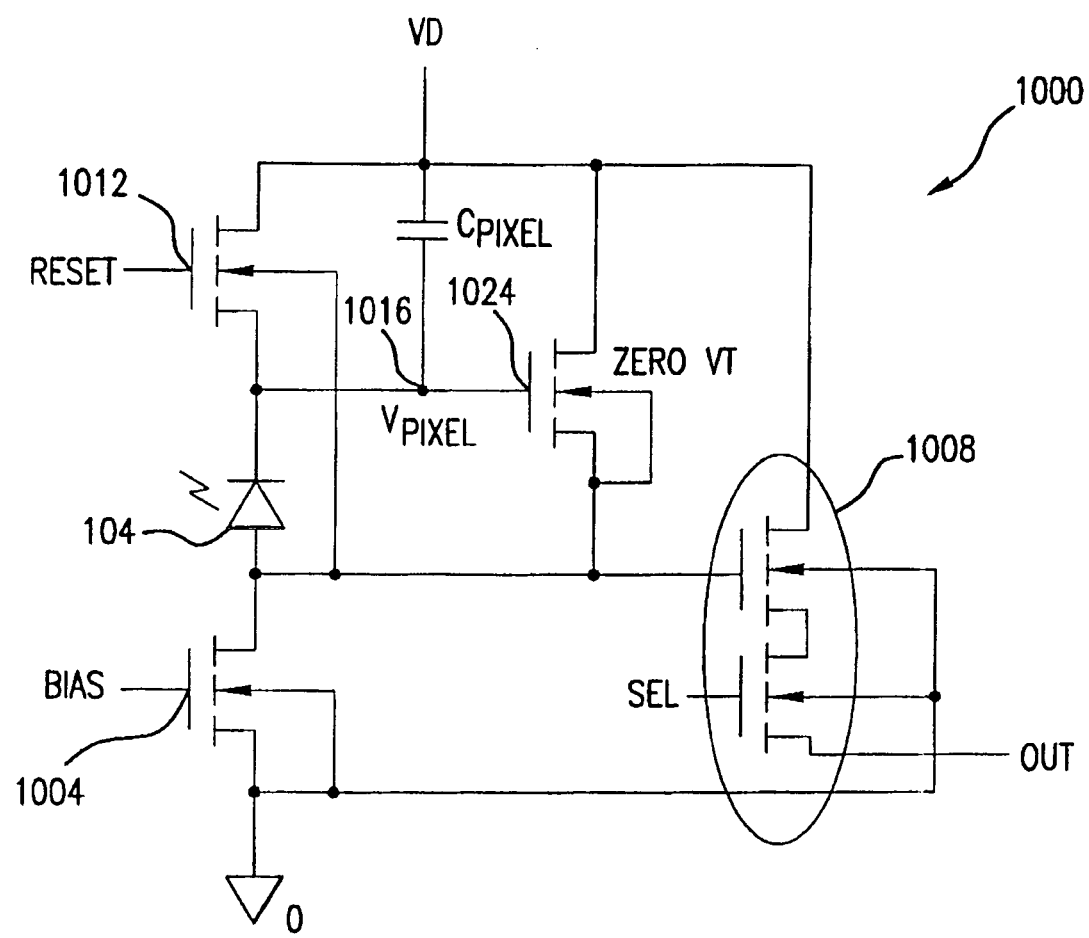
FIG. 10 is a schematic diagram of a seventh embodiment of the invention.

FIG. 10 shows a pixel 1000 which utilizes the subthreshold bias current source 1004 similar to that shown in FIG. 5 in combination with an NMOS readout circuit 1008 similar to that shown in FIG. 8. Because the source follower transistors within the NMOS readout circuit 1008 act as a voltage buffer, there is no need for a buffer amplifier.

Figure 11:
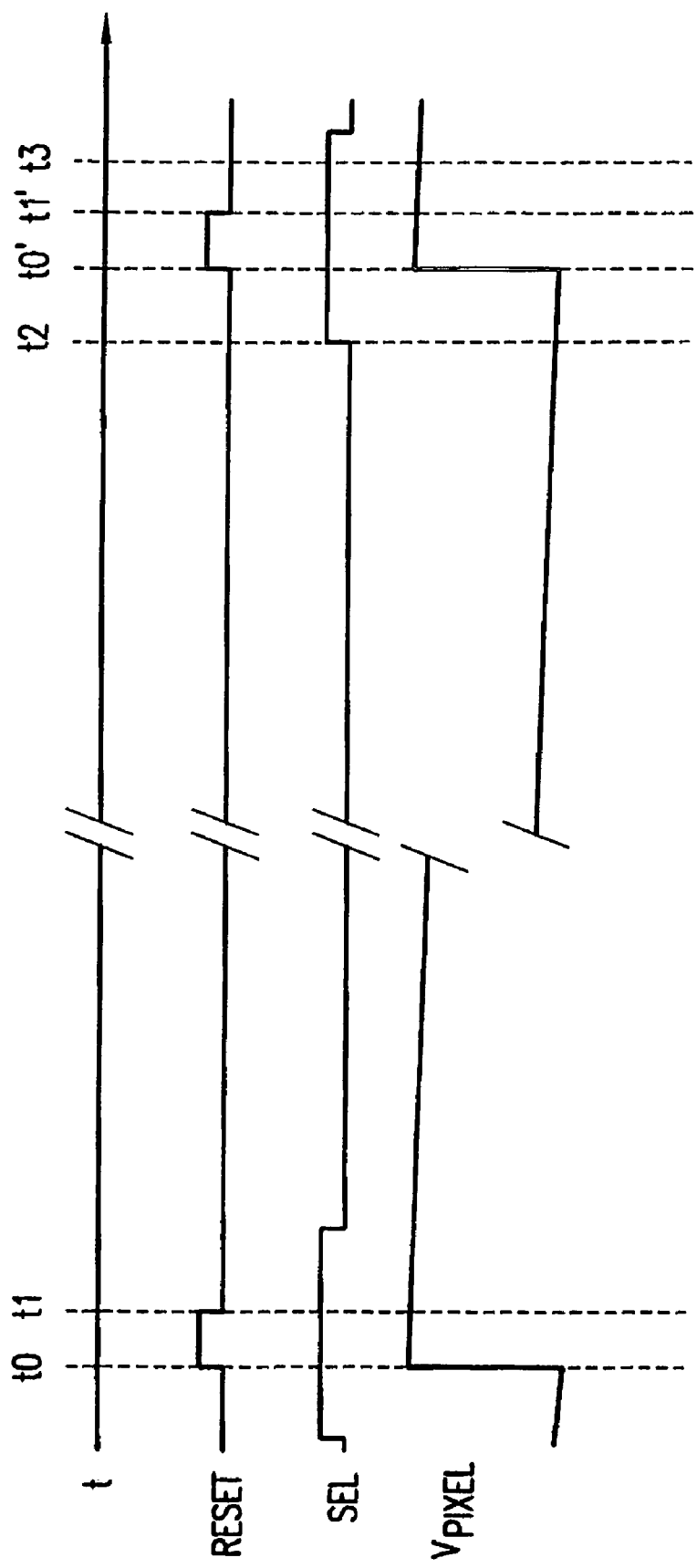
FIG. 11 is a timing diagram of the circuit of FIG. 10.

The sequence of operation of the pixel 1000, as well as all of the pixel embodiments of the present invention, can be divided into three basic periods: reset, integration, and readout. FIG. 11 shows the timing of the circuit of FIG. 10. At t=t0, the pixel is reset, thereby applying a reset pulse to the reset transistor 1012, while the subthreshold transistor 1004 generates a constant bias current with a constant gate bias. Supposing the high level of the reset pulse is at a voltage $V_D$, the voltage $V_{PIXEL}$ at the integration node 1016 and also at the guard well of the photodiode 104 can then described as follows:

$$V_{PIXEL} = V_D - V_{THRESHOLD\_1004} \quad (3)$$

The reset voltage on the photodiode 104 is read out through the transistor 1024 and read out circuit 1008 by application of a selection signal SEL to the read out circuit 1008. At t=t1, the signal integration process is begun. The voltage of the guard well of the photodiode 104 decreases as $V_{PIXEL}$ decreases, thus maintaining a zero bias condition between $V_{PIXEL}$ and the guard well. Following the integration period, at t=t2 another select pulse is applied to the readout circuit 1008, where the output voltage is then read at the OUT node. In order to achieve correlated double sampling, an offset signal is readout again at the next reset period t=t3. Subtracting the offset signal from the prior readout signal suppresses both the offset variations of the pixel and noise of the readout circuit. Thus, a low noise readout image can be obtained.

Figure 12:
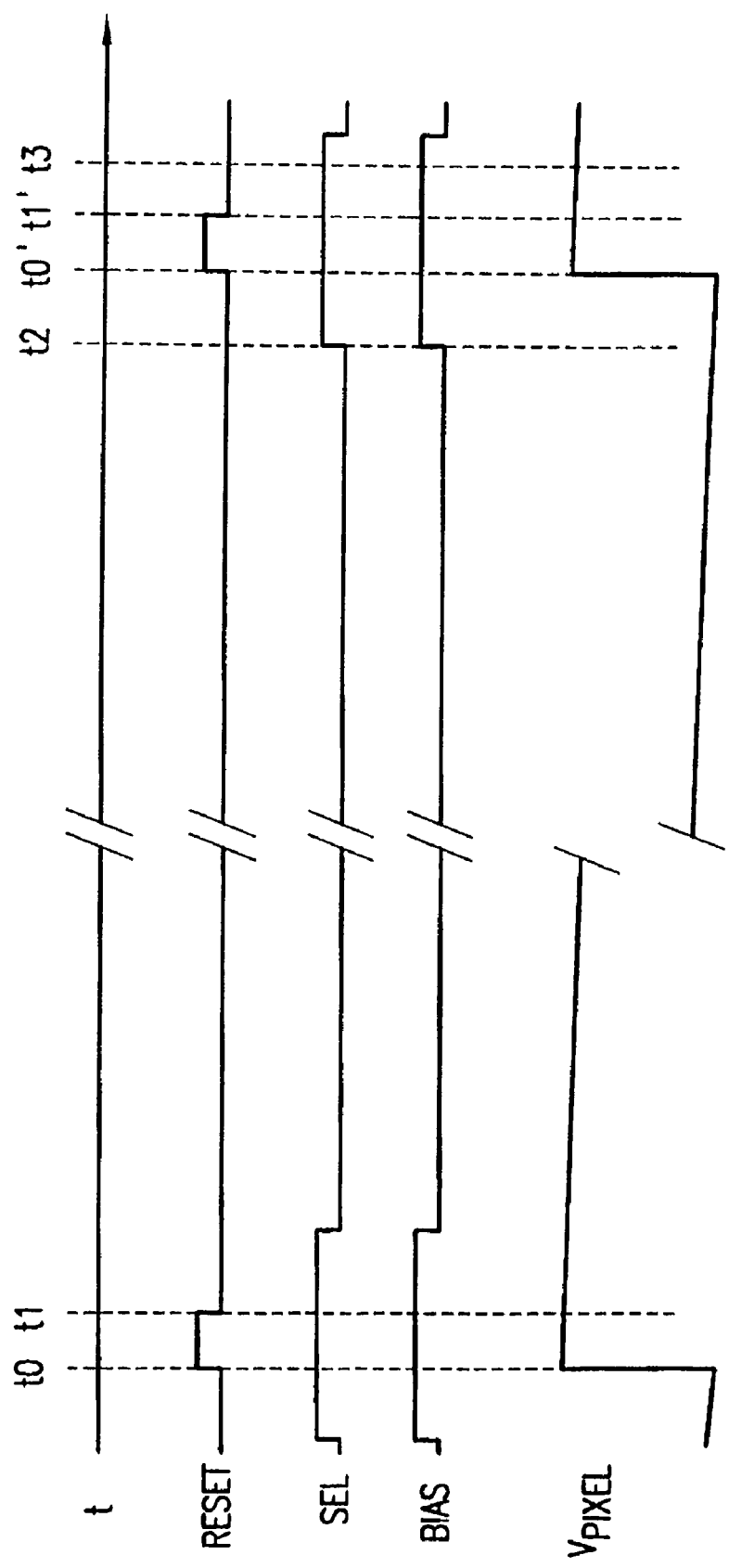
FIG. 12 is an enhanced timing diagram of the circuit of FIG. 10.

To reduce power the consumption of the circuit 1000, the bias current passing through the transistor 1004 is kept as small as possible. However, doing so has the effect of reducing the speed of the guard drive operation and increasing the duration of the reset period. To minimize these effects, a pulse is applied to the gate of the transistor 1004, as shown by the BIAS line in FIG. 12.

Figure 13:
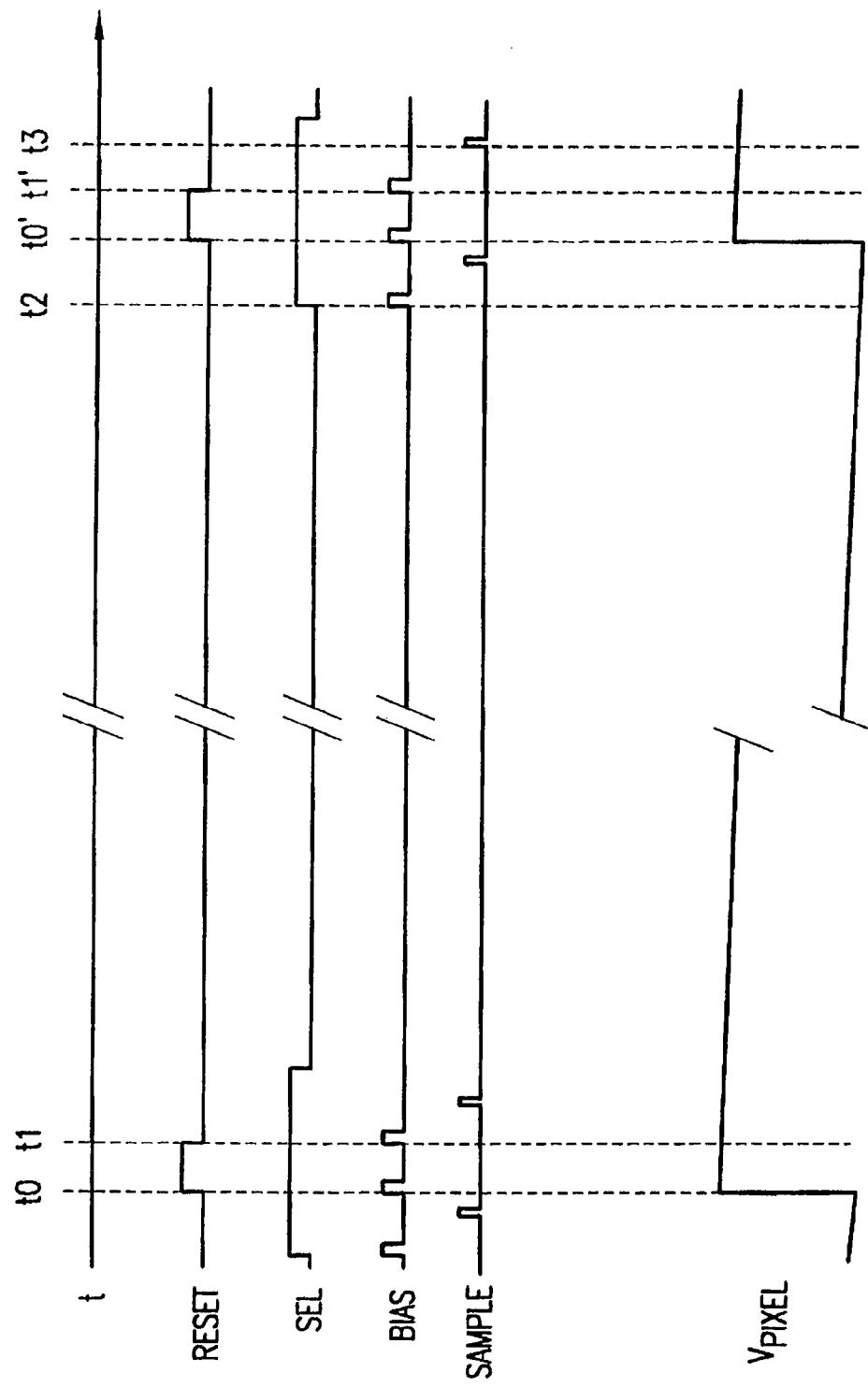
FIG. 13 is a further enhanced timing diagram of the circuit of FIG. 10.

To improve readout and reset speed, a transient bias current can be used at the beginning of every readout and reset operation. As shown in FIG. 13, at t=t2, t=t0', and t=t1', a short pulse is applied to the gate of the bias transistor 1004 as shown by the BIAS line, so that the voltage of the guard well is reduced by the pulse. After this pulse transitions low, the zero threshold transistor 1024 drives the guard well 304 of the photodiode 104 so that the voltage of the guard well 304 increases transiently so as to be close to VPIXEL. Sampling the pixel output with an identical waiting time, as shown by the line SAMPLE in FIG. 13, results in an output signal with good reproducibility. One advantage of such operation is that lower power consumption is achieved than the bias current modulation methods of FIGS. 1-9 because of the short pulse width of the bias pulse. This difference is readily apparent by contrasting the pulse width on the BIAS lines of FIG. 12 with that shown in FIG. 13.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. An imaging pixel comprising:
   a photo conversion device for producing an electrical signal at a first node thereof in response to incident light energy;
   a biasing transistor operating at sub-threshold level and connected to a second node of said photo conversion device, for maintaining a zero-bias across said photo conversion device;
   an NMOS source follower transistor located remotely from said photo conversion device and connected to said first node of said photo conversion device, for reading a signal from said photo conversion device;
   an NMOS selection transistor connected to said NMOS source follower transistor, for selecting a pixel of said imaging pixel;
   an electrical circuit for receiving said electrical signal at said first node and producing an imaging pixel output signal; and
   a circuit path for providing said imaging pixel output signal to said second node of said photo conversion device.

2. The imaging pixel of claim 1, wherein said bias transistor has a first source/drain region connected to said second node, a second source/drain region connected to ground, and a gate for receiving a bias control signal.

3. The imaging pixel of claim 1, wherein said bias transistor has a substrate coupled to ground.

4. An imaging pixel comprising:
   a photo conversion device for producing an electrical signal at a first node thereof in response to incident light energy;
   a biasing transistor operating at sub-threshold level and connected to a second node of said photo conversion device, for maintaining a zero-bias across said photo conversion device;
   an PMOS source follower transistor located remotely from said photo conversion device and connected to said first node of said photo conversion device, for reading a signal from said photo conversion device;
   an PMOS selection transistor connected to said PMOS source follower transistor, for selecting a pixel of said imaging pixel;
   an electrical circuit for receiving said electrical signal at said first node and producing an imaging pixel output signal; and
   a circuit path for providing said imaging pixel output signal to said second node of said photo conversion device.

5. The imaging pixel of claim 4, further comprising a read out circuit for receiving said imaging pixel output signal and selectively outputting said imaging pixel output signal.

6. The imaging pixel of claim 5, wherein said read out circuit comprises an access transistor for receiving a signal representing said imaging pixel output signal and selectively providing said received signal as said imaging pixel output signal.

7. The imaging pixel of claim 6, wherein said read out circuit further comprises another source follower transistor for providing said imaging pixel output signal to said access transistor.

8. The imaging pixel of claim 6, wherein said access transistor and source follower transistors are n-type transistors having a substrate coupled to ground.

9. A method for operating an imaging pixel comprising:
producing an electrical signal at a first node of a photodiode in response to incident light energy;
maintaining a zero voltage bias across said photodiode contained within said imaging pixel by operating said photodiode at a sub-threshold level;
resetting said photodiode;
reading out said electrical signal; and
using said electrical signal to produce an imaging pixel output signal with a conversion gain, wherein said conversion gain is determinable.

* * * * *